United States Patent
Waite et al.

(10) Patent No.: US 8,450,194 B2
(45) Date of Patent: May 28, 2013

(54) METHOD TO MODIFY THE SHAPE OF A CAVITY USING ANGLED IMPLANTATION

(75) Inventors: Andrew Waite, Beverly, MA (US); Younki Kim, Andover, MA (US); Stanislav Todorov, Topsfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 97 days.

(21) Appl. No.: 13/175,434

(22) Filed: Jul. 1, 2011

(65) Prior Publication Data

US 2013/0001698 A1    Jan. 3, 2013

(51) Int. Cl.
*H01L 29/78* (2006.01)
*H01L 21/265* (2006.01)

(52) U.S. Cl.
USPC .... 438/524; 438/705; 257/365; 257/E29.264; 257/E21.335

(58) Field of Classification Search
None
See application file for complete search history.

(56) References Cited

U.S. PATENT DOCUMENTS

| | | | |
|---|---|---|---|
| 7,045,407 B2 * | 5/2006 | Keating et al. | 438/198 |
| 7,303,999 B1 * | 12/2007 | Sriraman et al. | 438/719 |
| 7,851,313 B1 * | 12/2010 | Luo et al. | 438/285 |
| 7,867,883 B2 * | 1/2011 | Lee et al. | 438/525 |
| 2008/0116532 A1 * | 5/2008 | Sato et al. | 257/412 |
| 2009/0101942 A1 * | 4/2009 | Dyer | 257/288 |
| 2009/0137106 A1 | 5/2009 | Nunan | |
| 2009/0170331 A1 * | 7/2009 | Cheng et al. | 438/705 |
| 2010/0240186 A1 * | 9/2010 | Wang | 438/285 |

OTHER PUBLICATIONS

U. Jeong, Z.Y. Zhao, B.N. Guo, G. Li, and S. Mehta, Requirements and Challenges in Ion Implanter for Sub-100nm CMOS Device Fabrication, In Proceedings of the Conference of Application of Accelerators in Research and Industry: 17th Int'l. Conference, Denton, TX, Nov. 2003, p. 697-700.*

* cited by examiner

*Primary Examiner* — Thomas L Dickey
*Assistant Examiner* — Joseph Schoenholtz

(57) ABSTRACT

A method of modifying a shape of a cavity in a substrate. The method includes forming one or more cavities on a surface of the substrate between adjacent relief structures. The method also includes directing ions toward the substrate at a non-normal angle of incidence, wherein the ions strike an upper portion of a cavity sidewall, and wherein the ions do not strike a lower portion of the cavity sidewall. The method further includes etching the one or more cavities wherein the upper portion of a cavity sidewall etches more slowly than the lower portion of the sidewall cavity.

12 Claims, 10 Drawing Sheets

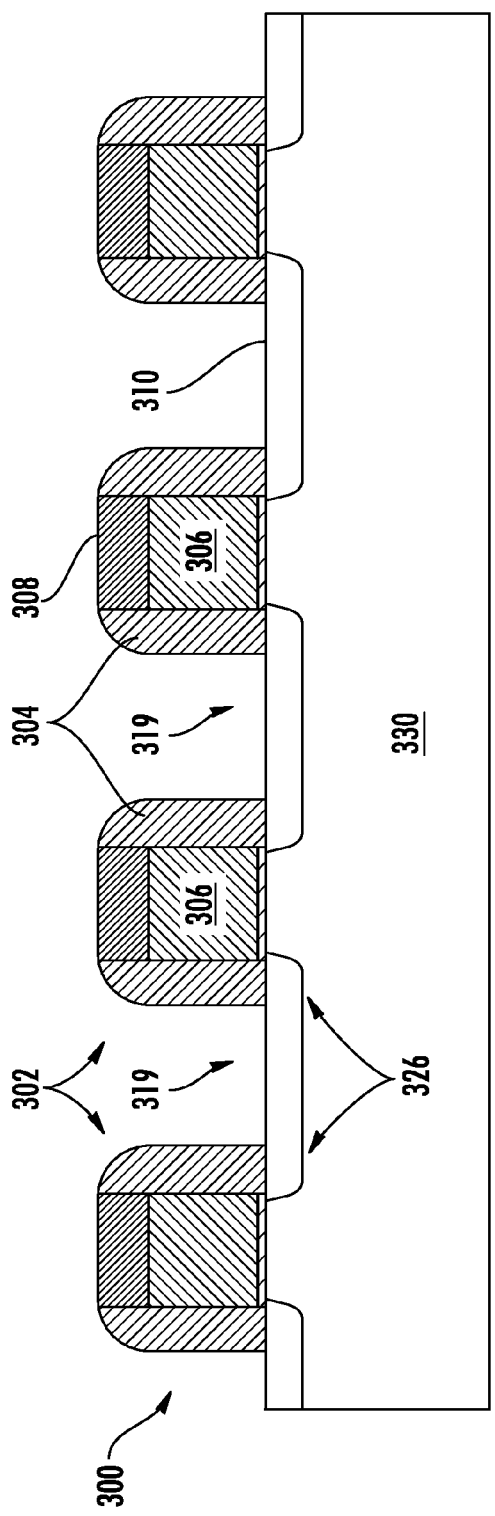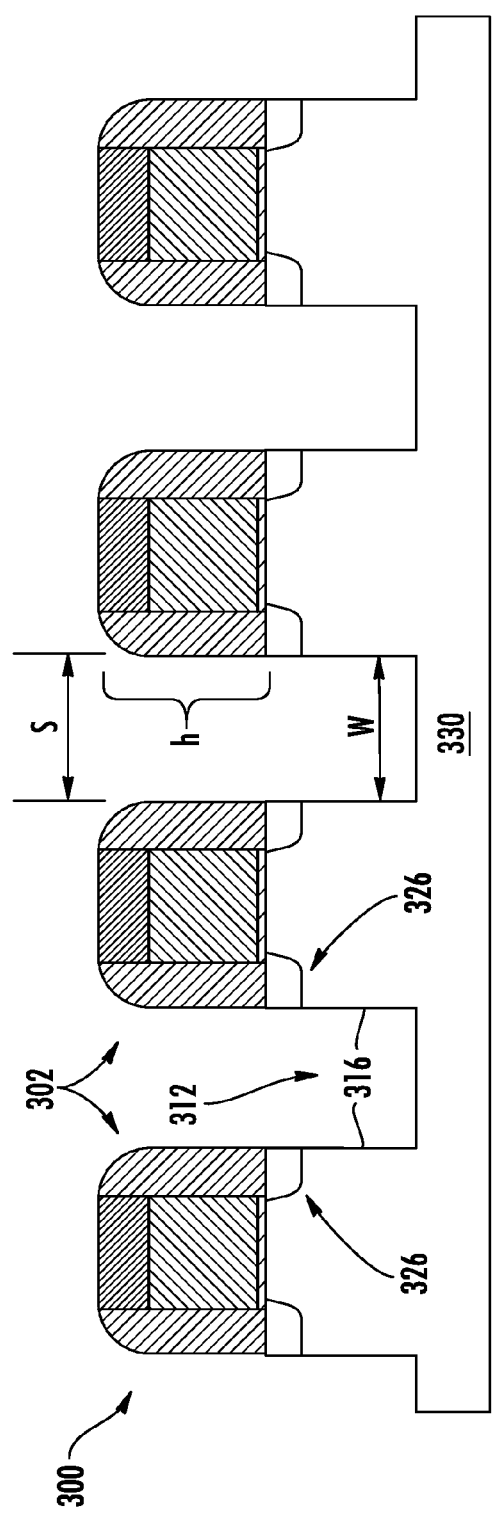

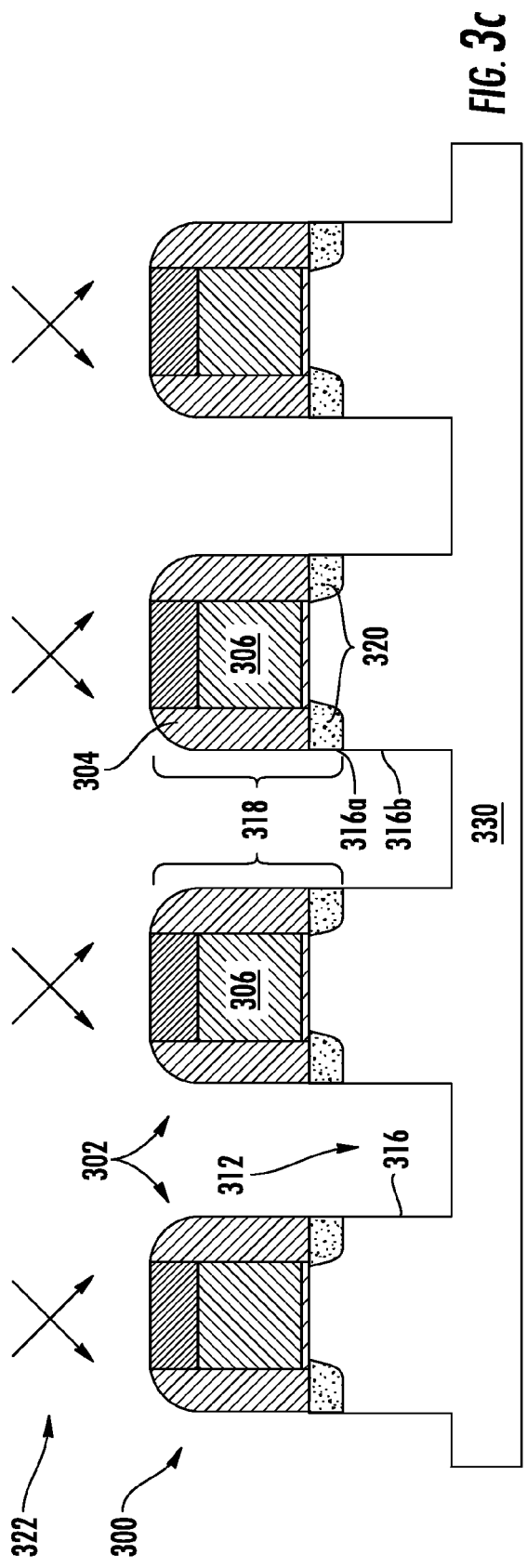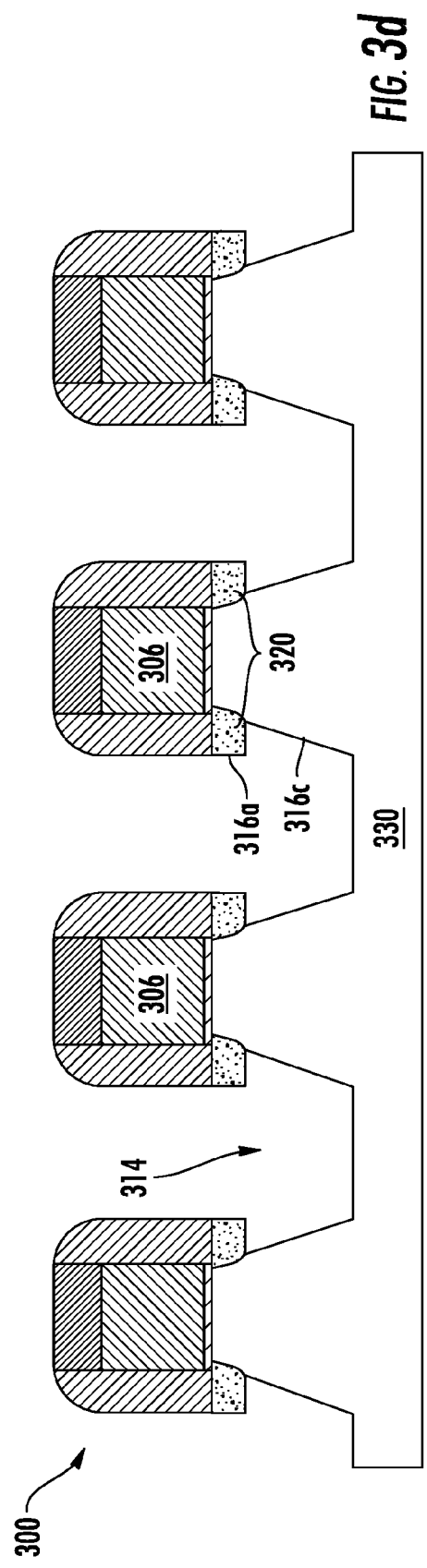

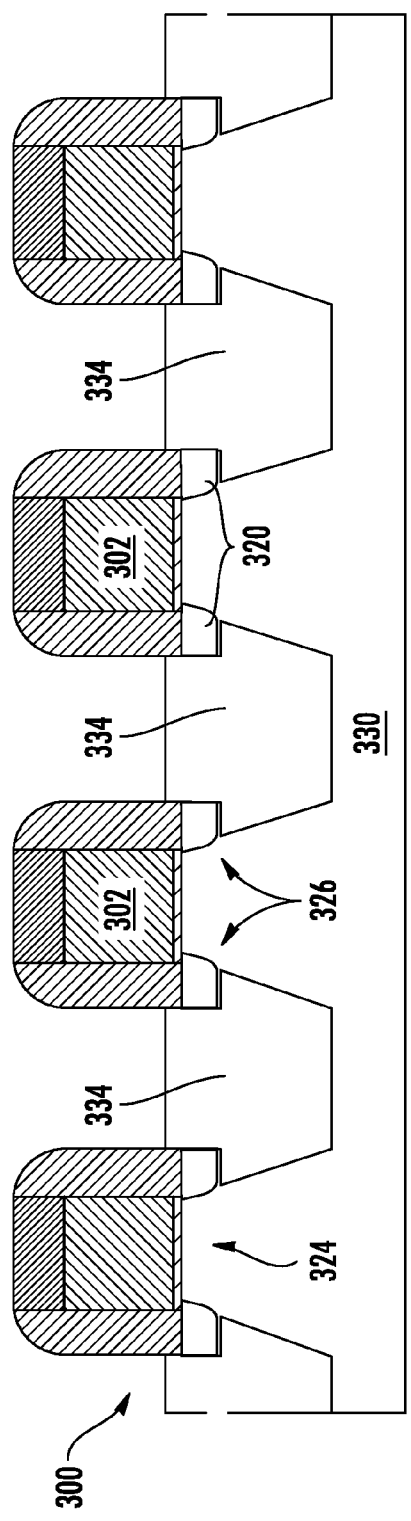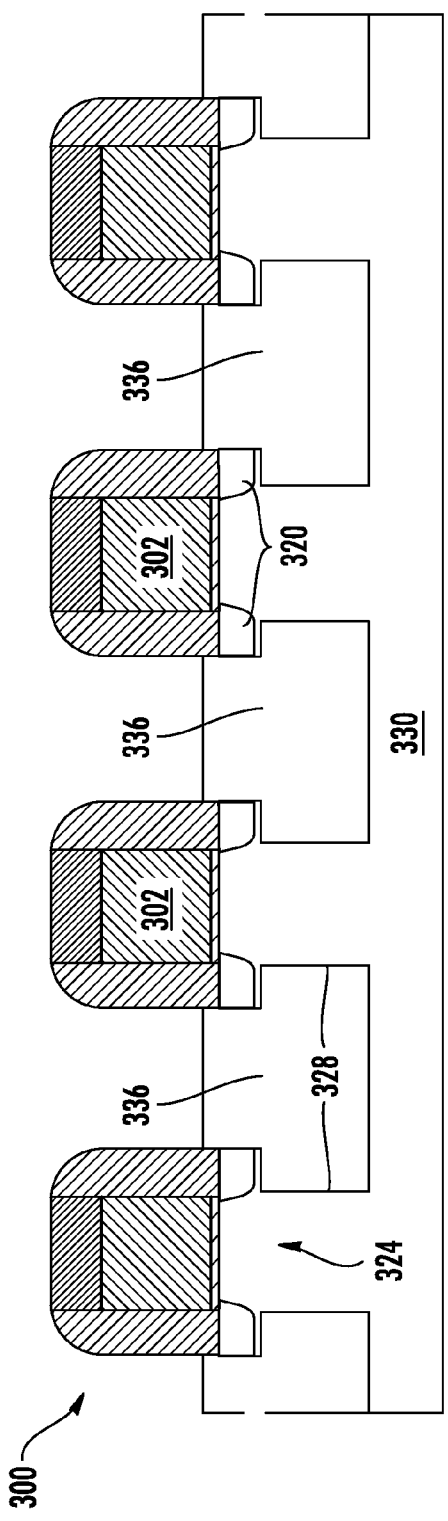

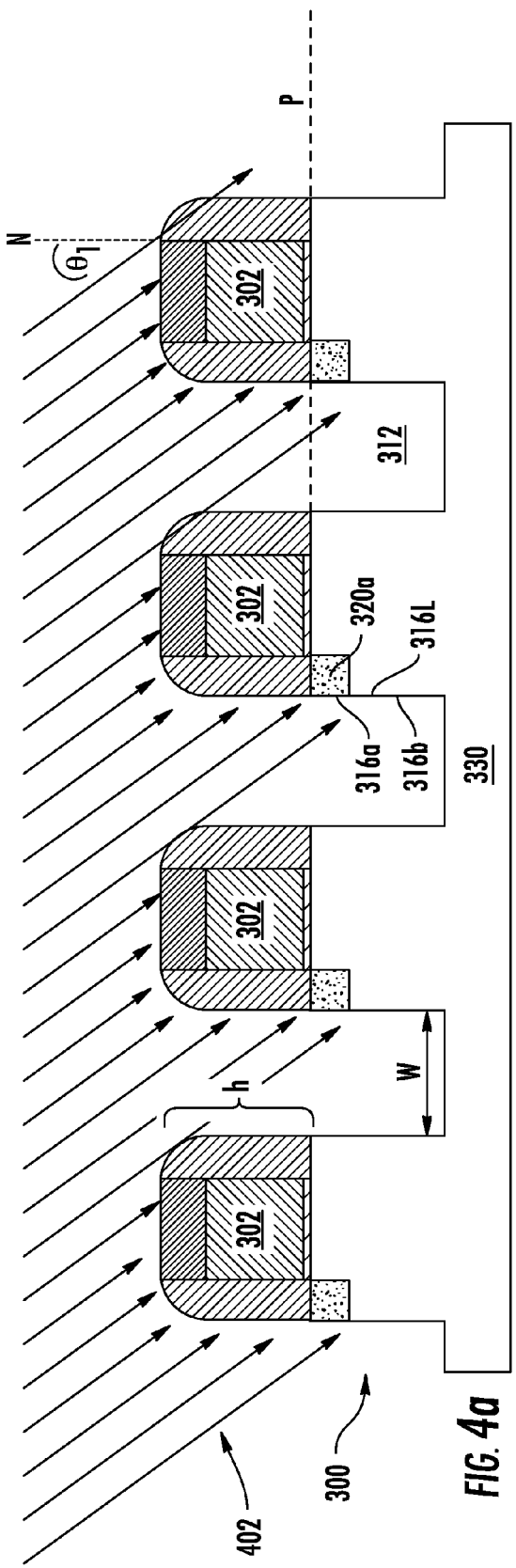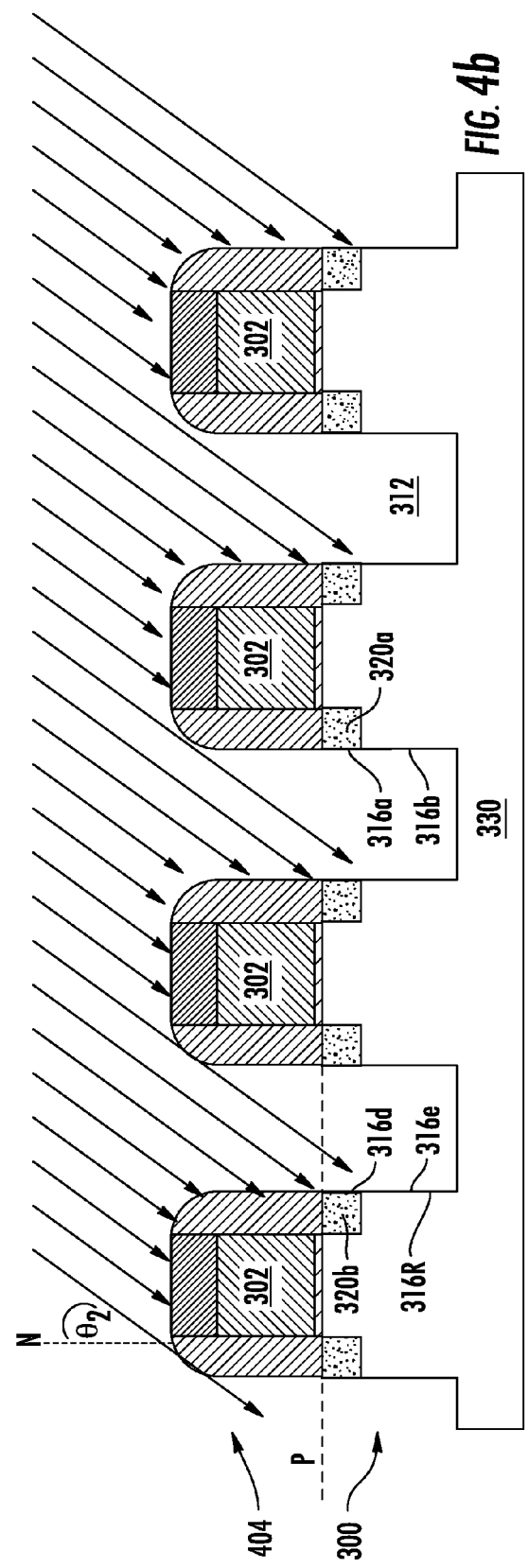

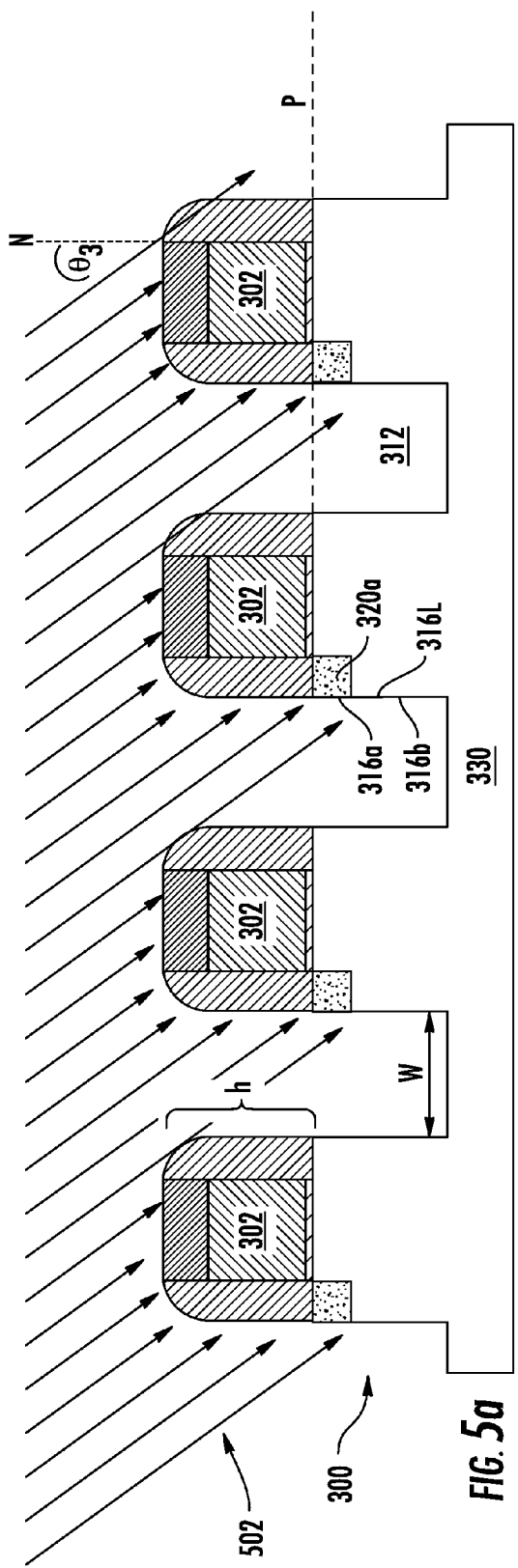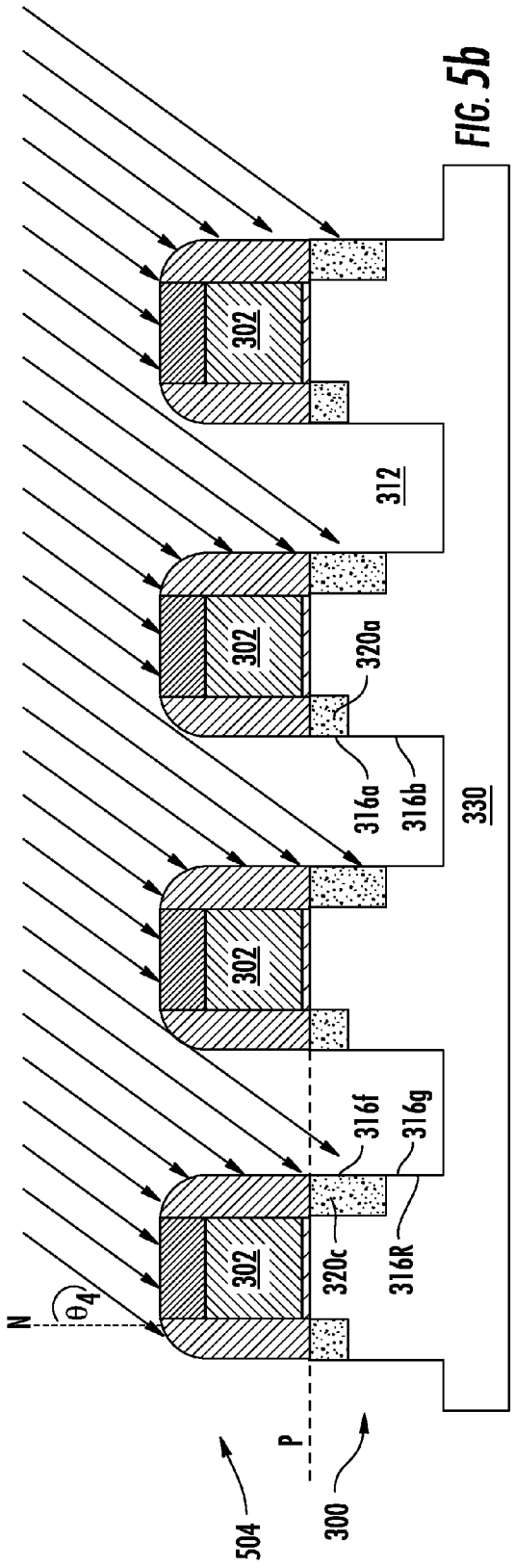

METHOD TO MODIFY THE SHAPE OF A CAVITY USING ANGLED IMPLANTATION

BACKGROUND OF THE INVENTION

1. Field of the Invention

Embodiments relate to the field of device manufacturing. More particularly, the present invention relates to a method, system and structure for performing implantation in a CMOS device.

2. Discussion of Related Art

As semiconductor devices such as CMOS devices scale to smaller dimensions, the ability to extract enhanced performance increasingly depends on integration of new device structures, materials, and processes. One recent innovation involves the use of embedded material to enhance device performance, such as an embedded SiGe (eSiGe) material, which may especially enhance PFET (P type field effect transistor) performance, and embedded Si:C (eSi:C), which may enhance NFET (N type field effect transistor) performance.

The formation of embedded structures entails etching portions of a source/drain (S/D) region to form a cavity, and refilling the cavity with a desired material, such as eSiGe, which may improve device properties by straining the crystalline lattice of field effect transistor (FET) and thereby improving majority carrier mobility.

FIGS. 1a-1d depict a prior art process for forming an eSiGe device. In the process depicted, cavities between gates are filled with e-SiGe material having "sigma shaped" sides, which allows for proximity between the eSiGe stressor and a neighboring gate. This technique has been developed for both 45 and 32 nm technology nodes for CMOS devices.

As illustrated at FIG. 1a, a substrate 10 includes multiple gates 12. The gates may act as masks for an etch process that etches the material of the substrate 10, which may be silicon. As depicted in FIG. 1b, the surface of the substrate 10 is etched between gates 12 to form a set of cavities 14 having steep sidewalls, which is typically formed by a dry etch process. Subsequently, as depicted at FIG. 1c, a wet etch is performed, which selectively etches certain crystallographic planes of the material of the substrate 10 faster than others, resulting in a "sigma shape" cavity 15. Typical etchants used for the wet etch process are potassium hydroxide (KOH) or tetramethyl ammonium hydroxide (TMAH). Subsequently, as depicted at FIG. 1d, embedded material 16, which may be a SiGe or Si:C material, is regrown in the cavities 15.

The embedded material 16 may induce a stress in the channel regions under gates 12, thereby improving performance, as noted. However, the formation of cavities 15 may encroach upon the extension regions 18 that lie underneath gate sidewalls 20. Because of the nature of the wet etch process, material of the substrate 10 may be removed from extension regions 18 during formation of cavities 14, which may undesirably affect device properties after the cavities are filled with embedded material 16.

In order to prevent or retard wet etching of the extension regions 18 during cavity 15 formation, it may be desirable to protect the extension regions 18 before subjecting the cavities 14 to a wet etch. For example, the etch rate of silicon substrates in KOH/TMAH may be lower when the silicon is amorphized. Accordingly, amorphization of extension regions may be desirable.

FIGS. 2a and 2b depict one conventional approach for pre-amorphizing a substrate 10 before cavity formation. As illustrated in FIG. 2a, ions 22 bombard the substrate 10, forming amorphous regions 26 between gates 24 that overlap extension regions 18. In a subsequent step, a sidewall material 28, which may be an insulator such as silicon nitride, is deposited by a known method, such as low pressure chemical vapor deposition (LPCVD) or atomic layer deposition (ALD) However, after deposition of sidewall material 28 by LPCVD or ALD, the thermal budget that is typically required to form the sidewalls may be sufficient to recrystallize the amorphous regions 26, as depicted in FIG. 2b. After recrystallization, the substrate 10 retains its original single crystal structure including in the extension regions 18, rendering them susceptible to etch during formation of sigma shaped cavities. It will be appreciated, therefore, that improvements are desirable in present day methods for producing cavity structures in substrates.

SUMMARY

In one embodiment, a method of modifying a shape of a cavity in a substrate comprises forming one or more cavities on a surface of the substrate between adjacent relief structures. The method further comprises directing ions toward the substrate at a non-normal angle of incidence, wherein the ions strike an upper portion of a cavity sidewall, and wherein the ions do not strike a lower portion of the cavity sidewall. The method also comprises etching etching the one or more cavities wherein the upper portion of a cavity sidewall etches more slowly than the lower portion of the sidewall cavity.

In a further embodiment, a device structure comprises a plurality of transistor gates arranged on a substrate surface, each transistor gate having an extension region disposed under a transistor sidewall, wherein the extension region comprises a first semiconductor material. The device structure also comprises one or more embedded regions, each embedded region comprising a second semiconductor material and disposed within the substrate and between adjacent transistor gates. Each embedded region further comprises a pair of angled sidewalls, wherein the extension region overhangs a portion of the embedded region.

BRIEF DESCRIPTION OF THE DRAWINGS

FIGS. 3a-3f depict a side cross-sectional view of a CMOS device structure at several stages of processing according to various embodiments.

FIGS. 4a and 4b depict aspects of a angled implantation of cavities in a substrate according to further embodiments.

FIGS. 5a and 5b depict aspects of angled implantation to form the cavity structure of FIG. 3g according to further embodiments.

DESCRIPTION OF EMBODIMENTS

Figure 1A:
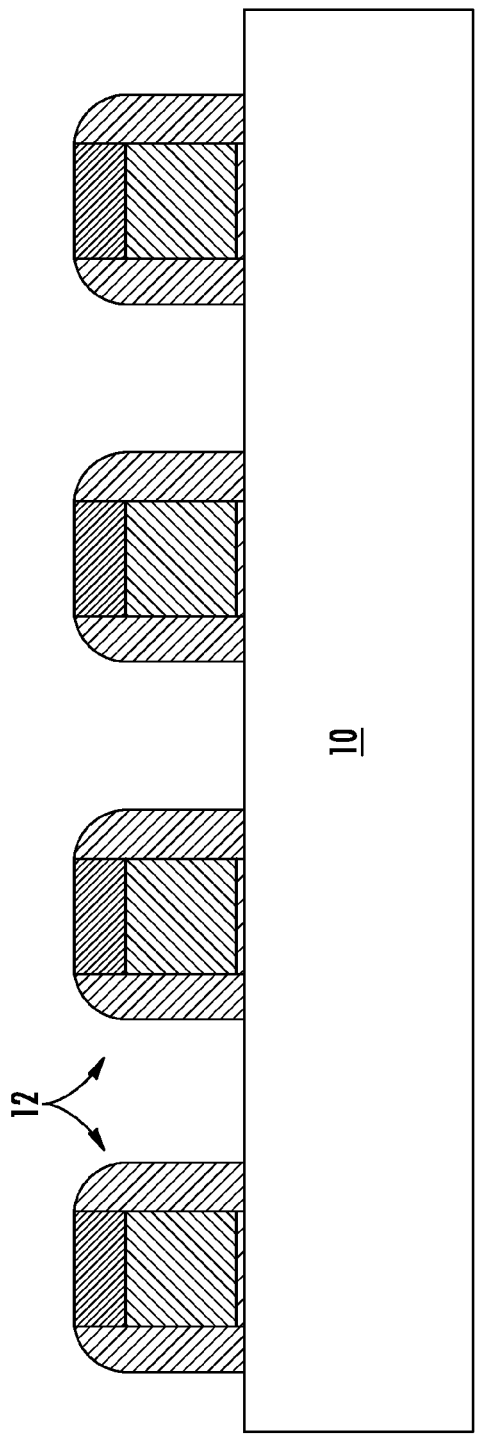
FIGS. 1a-1d depict a prior art process for forming embedded stressors.
Figure 1B:
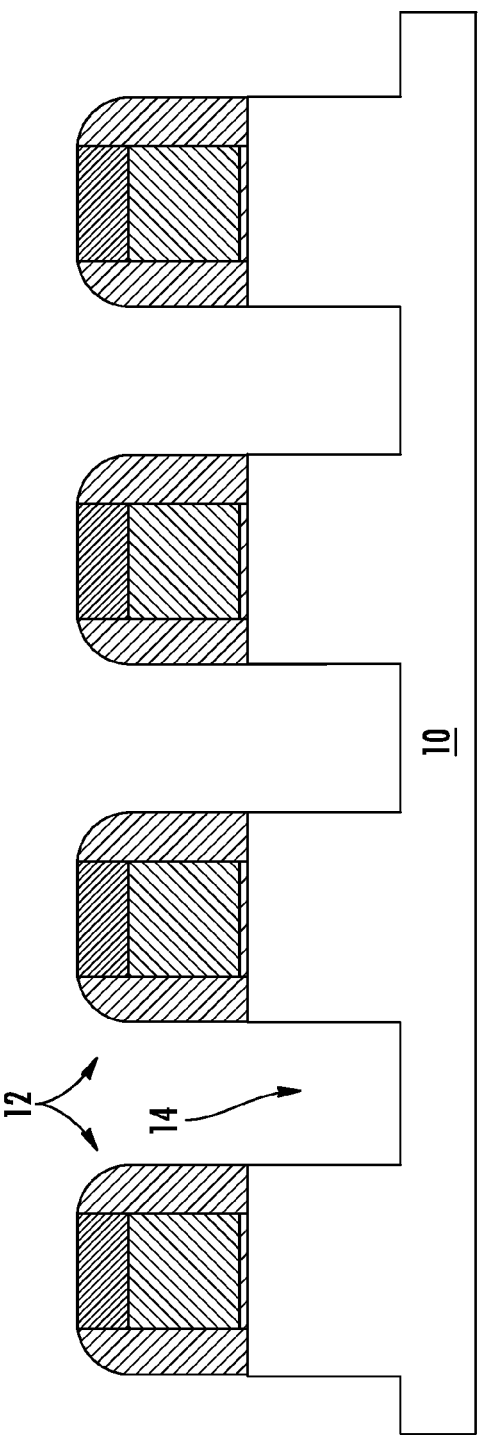
Figure 1C:
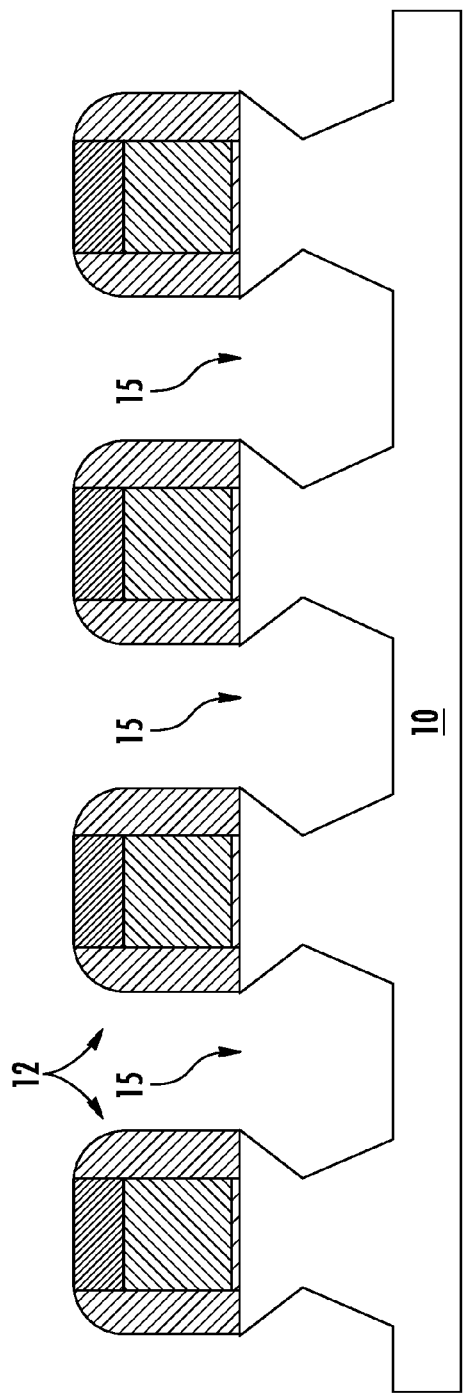
Figure 1D:
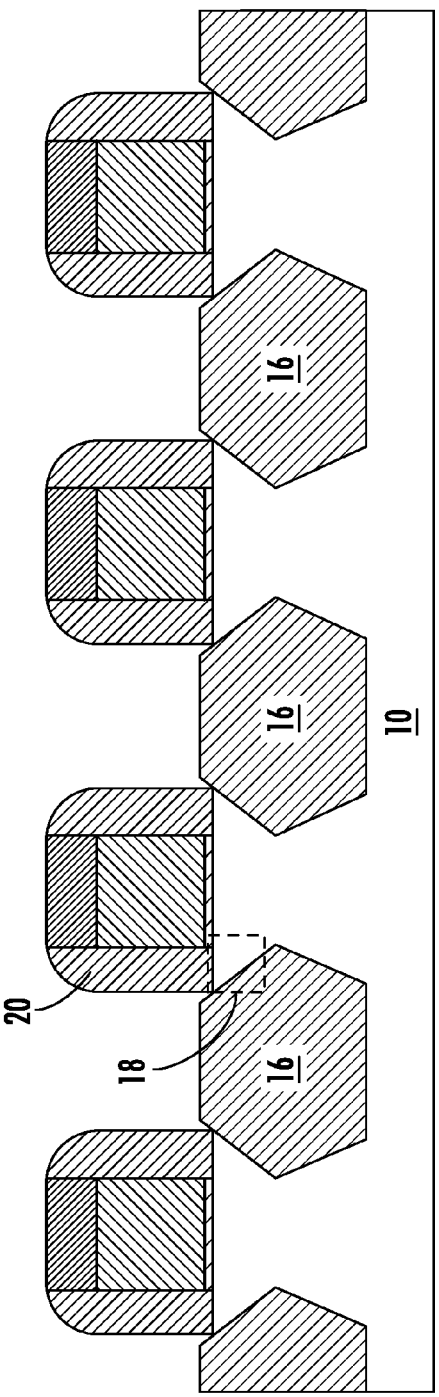
Figure 2A:
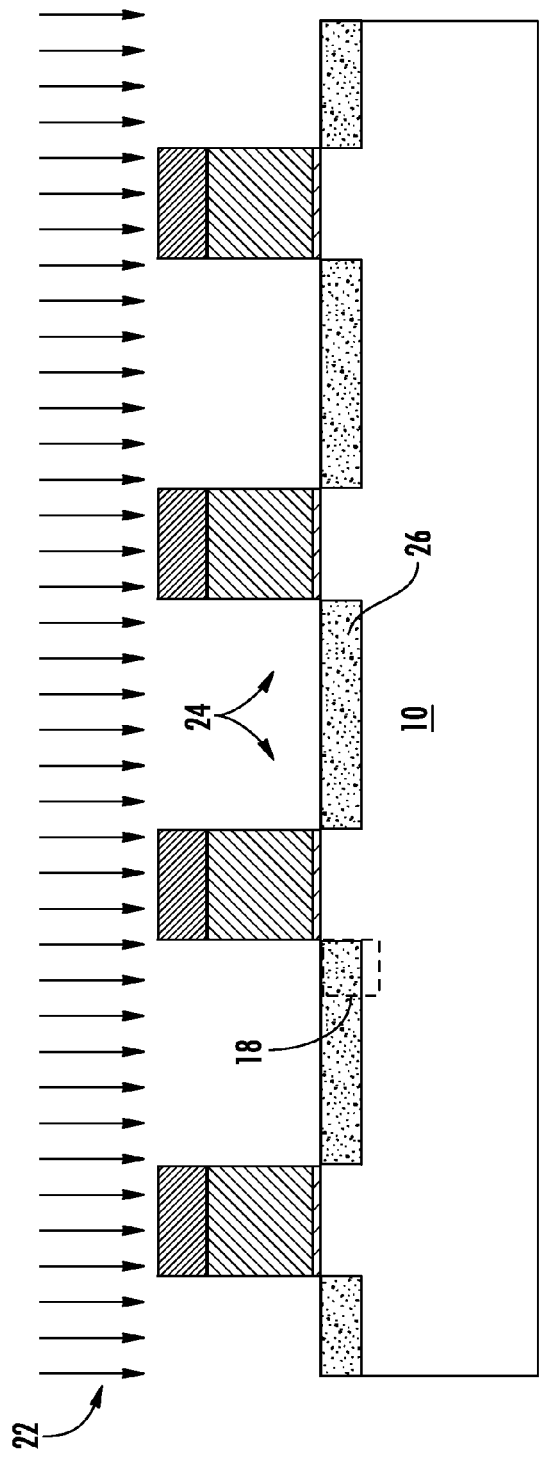
FIG. 2 depicts another prior art implantation process.
Figure 2B:
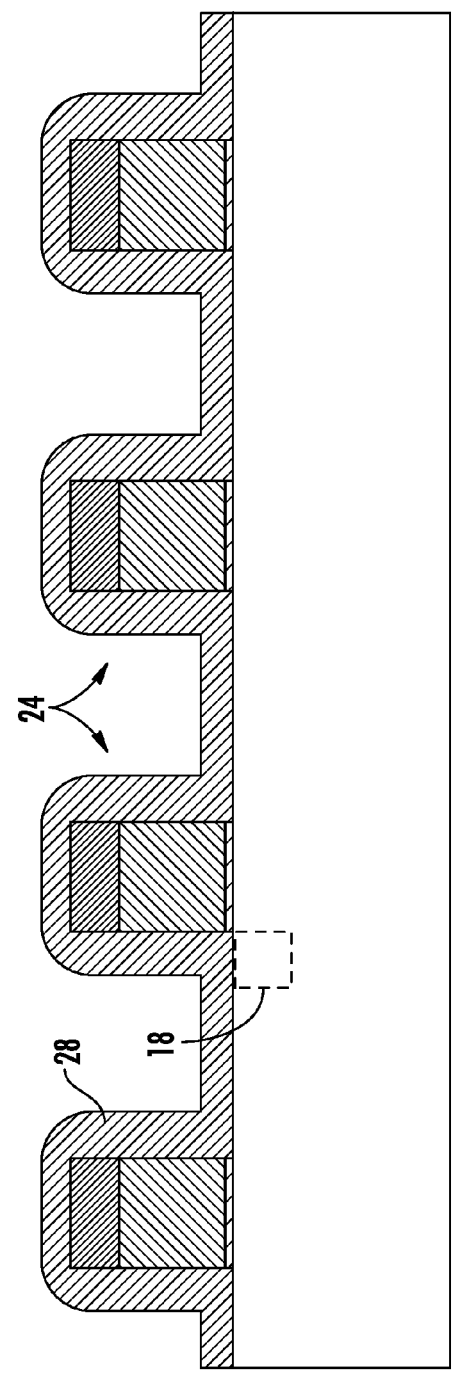

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the deficiencies associated with the methods noted above, novel and inventive techniques and systems for implanting selected regions of a substrate are introduced. In particular, the present disclosure focuses on techniques and device structures involving ion implantation processes for controlling the shape of cavities in substrates, such as CMOS devices. Embodiments of the present disclosure facilitate formation of embedded stressors, such as eSiGe or eSi:C materials, in order to enhance performance of PFETs and/or NFETs. Advantageously, some embodiments employ angled ion implantation to alter the properties of portions of a cavity to protect selected device regions, such as extension regions of a transistor gate, before additional cavity etching and growth of embedded material takes place.

Turning to the figures, in FIGS. 3a-3f are depicted side cross-sectional views of a substrate at several stages of processing according to embodiments of the disclosure. The substrate 300 may represent a MOS device, such as a CMOS device at a stage of processing after formation of gates 302. The gates 302 include gate sidewalls 304 and may further include gate portion 306, which may be a doped semiconductor material, and a gate contact 308.

As depicted, substrate 300 also includes implanted regions 310. As is well known, the implanted regions 310 may comprise dopant species that form a low resistance path to respective channel regions (not shown) underlying each gate 302. The implanted regions 310 may, but need not be, formed by ion implantation before gate sidewalls 304 are formed. After gate sidewall 304 formation, the extension regions 326 of the substrate 300 that lie under gate sidewalls 304 form part of the implanted regions 310.

In a subsequent stage of processing depicted at FIG. 3b, the source/drain (S/D) regions 319 of the substrate 300 that lie between adjacent gates 302 are etched, forming cavities 312. The gates 302 act as a mask during this process, which provides an etchant that preferentially etches the material of substrate base 330, which may be bulk silicon, or a silicon-based material, such as silicon-on-insulator (SOI). In various embodiments, the etch is a known dry etch, which may etch the substrate S/D regions 319 anisotropically to form cavity sidewalls 316 that are substantially vertical within cavities 312. The width W of the cavities 312 may be about the same as the spacing S between adjacent gate sidewalls 304, as illustrated. At this point, extension regions 326, as well as the rest of the underlying substrate base 330, may form a single crystalline material.

At a subsequent stage depicted in FIG. 3c, ions 322 are directed toward the substrate 300. In various embodiments, the ions 322 are directed toward the substrate 300 at a discrete set of angles of incidence. The angles of incidence are chosen so that ions 322 strike upper portions 316a of cavity sidewalls 316, but do not strike lower portions 316b of cavity sidewalls 316. Referring again to FIG. 3b, in various embodiments, the height h of gates 302 and spacing S are configured so that each gate 302 screens a portion of ions 322, such that only regions 318 along the side of gates and top of cavities 312 are struck by ions.

In various embodiments, the ion species and ion dose of ions 322 are chosen to alter the properties of upper portions 316a of cavity sidewalls 316 that lies proximate the gate sidewalls 304. The altered regions 320 produced thereby may extend under the gate sidewalls 304 as illustrated. The altered regions 320 may overlap partially or completely the extension regions 326.

In various embodiments, the ion energy is chosen to create altered regions 320 to a desired distance from the cavity sidewalls 316. Thus, for example, altered regions 320 may extend under the majority of gate sidewalls 304, as depicted.

In particular, the exposure of upper portions 316a to ions 322 is chosen to alter the etchability of upper portions 316a with respect to the lower portions 316b. In some embodiments, the ions 322 may create altered regions 320 that comprise amorphized regions. Examples of ions that may be well suited for amorphization include Ge, Xe, other noble gases, or other species known to those skilled in the art. In some embodiments, the ion dose used to create amorphized regions is about $1E14/cm^2$ to about $2E15/cm^2$ and the ion energy is about 1 keV to about 20 keV. It is to be noted that the optimum energy and dose for amorphization may vary with ion species. For example, a different dose may be effective for amorphizing silicon using Xe than Ge, due to the differences in atomic level scattering processes that arise from the different atomic mass of the ions, among other factors.

In other embodiments, the exposure to ions 322 may be a non-amorphizing implant, such as an implant involving boron (B) or a boron-containing ions. As has been previously observed, incorporation of boron in silicon at concentrations above about $1E19/cm^2$ substantially reduces the silicon etch rate in TMAH and KOH solutions. For example, a reduction in etch rate by a factor of about ten to one hundred is observed for concentrations of boron in the range of $1-4 E20/cm^2$. Accordingly, various embodiments employ boron ion doses and energies that are effective in raising the boron concentration proximate the cavity sidewall to levels above $1 E19/cm^2$ and in particular above $1 E20/cm^2$. Of course, other n-type or p-type dopants also may be used in some instances.

At a further stage depicted in FIG. 3d, cavities 312 are subjected to another etch, which may be a liquid (wet) etch. In some embodiments, the wet etch is performed using etchants that preferentially etch substrate base 330 along certain crystallographic directions. For silicon-based substrates, etchants such as KOH or TMAH may be used. The resulting final cavity 314 may have sidewalls whose lower portions 316c are angled, as depicted. For example, in silicon, the fastest etching orientation is the (110) planar orientation (or "plane"), which may etch on the order of twice as fast as the (100) plane, depending on etchant concentration and etch temperature. Moreover, the (111) plane is an extremely slowly etching plane when exposed to KOH. Depending on the KOH concentration and temperature during the wet etch, the (111) plane may etch at a rate less than 1% the rate of the (110) plane. Thus, during exposure to KOH or TMAH, the sidewall 316, which may initially present a (100) orientation (FIG. 3c), may etch away to reveal the slowly etching (111) plane (FIG. 3d). The lower portions 316c of sidewalls of final cavity 314 may therefore correspond to the slowly etching crystallographic planes in the substrate base 330, such as the (111) family of planes.

As further illustrated in FIG. 3d, the upper portions 316a may be substantially intact. As noted above, the etch rate of amorphous silicon in etchants such as KOH or TMAH is greatly reduced compared to the etch rate for crystalline silicon. Similarly, silicon regions having substantial boron doping, even if crystalline, may etch much more slowly than regions without boron doping or those regions having a much lower level of boron doping. Accordingly, the profile of final cavity 314 may have an overhang structure in which the altered region 320 remains unetched or etched less than regions proximate the lower portions 316b. The lesser etching of altered region 320 thereby leads to an undercut of the altered region 320 by the sloped lower portion 316c of the cavity sidewall formed by etching unaltered crystalline regions proximate lower portions 316b of original cavity wall 316.

At a further stage depicted in FIG. 3e, material is regrown within final cavities 314. In various embodiments, the embedded region 334 may be an embedded stressor, such as a silicon:germanium alloy (SiGe), Ge, or Si:C material, which materials may be epitaxially regrown within the final cavities 314. The term "Si:C," as used herein, generally refers to a metastable alloy of silicon and carbon, as opposed to the known stable stochiometric SiC compounds, where the silicon/carbon ratio is 1/1. In Si:C alloys, a dilute concentration of carbon is dissolved in a crystalline silicon lattice, in which the carbon may reside substitutionally or interstitially in concentrations of about three atomic percent or less.

The epitaxial growth process may be a chemical vapor deposition process, atomic layer deposition, molecular beam epitaxy or other process capable of forming an epitaxially regrown material. The embedded region 334 may extend to regions proximate the gates 302, which may increase the strain in a channel region 324, thereby improving device performance. As noted above, when Si:C is formed as an embedded stressor, this tends to introduce tensile stress in the nearby silicon, which may be employed to enhance NFET performance, while SiGe alloys, which induce compressive stress in silicon, may enhance PFET performance. Moreover, after formation of the embedded regions 334, the extension regions 326 may remain substantially intact. In some embodiments, the overall shape of the regrown material may resemble a keystone, as depicted in FIG. 3e. In embodiments in which altered regions 320 are amorphized, during the formation of embedded regions 334 the thermal budget may be sufficient to recrystallize the altered regions, such that extension regions 326 are crystalline at the stage depicted at FIG. 3e.

FIGS. 4a and 4b depict aspects of angled implantation of cavities in a substrate according to further embodiments. In some embodiments, the process of FIGS. 4a and 4b may represent part of the implantation process generally illustrated at FIG. 3c. In the example depicted, in a first exposure, ions 402 are implanted into cavities 312 at a first angle $\theta_1$ with respect to a normal N to substrate plane P. In various embodiments, the ions 402 may be substantially parallel to one another such that the angle of incidence $\theta_1$ for each ion is about the same as for other ions, for example, within 2 or 3 degrees. The height h of gates 302 and spacing W between gates may be configured so that ions 402 strike only upper portion 316a of left cavity sidewalls 316L, and do not strike lower portion 316b, as noted previously. The exact length of upper portion 316a may be adjusted by adjusting the angle of incidence $\theta_1$. However, in some embodiments, the angle of incidence $\theta_1$ is about 30 degrees or larger, which may facilitate formation of altered regions 320 that lie proximate the upper portion 316a of left cavity sidewall 316L.

More particularly, the combination of ion species, ion incidence angle, ion dose and ion energy of ions 402 is configured to create altered regions 320a that lie underneath "left" sides of the gates 302. To the extent that the height h and spacing W between gates have the same respective values among all gates 302, each altered region 320a formed by ions 402 may be about the same size. In other words, for a given incidence angle and aspect ratio (h/W ratio) ions 402 are shadowed by each gate 302 in the same fashion, such that the ions strike left cavity sidewalls 316L over the same area corresponding to upper portions 316a.

In a second exposure illustrated in FIG. 4b, ions 404 are directed toward substrate 300 at a second angle of incidence $\theta_2$. In various embodiments, second angle of incidence $\theta_2$ may form an angle having the same magnitude with respect to the normal N to plane P as first angle of incidence $\theta_1$, but may be in a different direction, such that the trajectories of ions 404 form a mirror image to ions 402. In this manner, only upper portions 316d of right cavity sidewalls 316R are struck by ions, whereas lower portions 316e of sidewalls 316 are not struck. In various embodiments, the species, ion energy and ion dose of ions 404 are configured to produce altered regions 320b on the "right" side of gates 302 that are substantially the same as altered regions 320a. The altered regions 320a, 320b may be used to protect the extension regions of gates 302 from subsequent processing, such as wet etching that may be used to form larger cavities to house embedded stressors, as discussed previously.

In further embodiments, the implantation of ions 402 and 404 may be accomplished in a single exposure using, for example, a plasma based processing system in which ions are provided over an angular range that includes $\theta_1$ and $\theta_2$. Additional description of processing systems capable of simultaneously providing ions over an angular range can be found in U.S. patent application Ser. No. 12/417,929, filed Apr. 3, 2009, and issued as U.S. Pat. No. 7,767,977; Ser. No. 12/418,120, filed Apr. 3, 2010; Ser. No. 12/644,103, filed Dec. 22, 2009; and Ser. No. 12/848,354, filed Aug. 2, 2010, each of which is herein incorporated in its entirety by reference. In particular, the distribution of angles of incidence of ions in such a system may be tuned to produce a relatively higher fraction of ions at the desired angles of incidence $\theta_1$ and $\theta_2$ so that regions where ion bombardment is not desired receive lesser ion flux.

It is to be noted that in some embodiments the material in embedded regions 334 may be vary between different regions of a substrate 300. Thus, a dual embedded stressor CMOS device may be fabricated consistent with embodiments of the present disclosure. For example, in the case of a CMOS device that has a transistor channel made of silicon, in some cavities, a SiGe material may be regrown, while in other cavities an Si:C material may be regrown. Alternatively, a composition of a SiGe material may vary between cavities. In particular, embedded stressors grown adjacent to PFETs may be an SiGe material, while those grown adjacent to NFETs may be an Si:C material.

Moreover, the ion exposure process used to form altered regions 320 may vary between cavities used to form embedded PFET stressors and cavities used to form embedded NFET stressors. For example, an exposure that either comprises an amorphizing implant or a non-amorphizing boron implant may be appropriate for PFET stressor formation. In the case of an NFET stressor formation, an amorphizing implant in which altered regions 320 become amorphous may be appropriate. However, a boron implant may not be appropriate to form altered regions 320. This is because the level of boron that may be effective in protecting the altered regions 320 from a subsequent wet etch may alter the electrical properties of the NFET extension region in a manner that cannot easily be compensated. As is well known, the extension regions in NFET transistors comprise n-type dopants, such as phosphorous or arsenic, which are used to control device operation. Accordingly, unwanted boron dopant atoms may deleteriously affect such operation. Thus, in some embodiments of a CMOS device, the PFET may comprise an embedded SiGe stressor that is grown in a cavity formed by a boron doping process near the extension region along a cavity sidewall, while an NFET may comprise an Si:C stressor grown in a cavity formed by an amorphizing implant of the extension region along a cavity sidewall using Ge, Xe or another non-electrically active species.

Moreover, the shape of cavities may vary in different embodiments in accordance with the etch parameters of the cavity etch performed after implantation. FIG. 3*f* depicts another embodiment in which the etched cavity sidewalls are more vertically oriented (that is, are more parallel to the normal N to plane P), which results in the embedded regions 336 having more vertical final cavity sidewalls 328. This latter cavity sidewall profile may occur when the etch rate anisotropy for different crystallographic planes is relatively less than the case depicted in FIG. 3*e*. However, embodiments where etch rate does not strongly depend on crystallographic planar orientation, a timed etch may be required in order to ensure that final sidewall cavities do not become overetched, since, unlike TMAH or KOH based etches, the etch process is not self limiting.

Figure 3G:
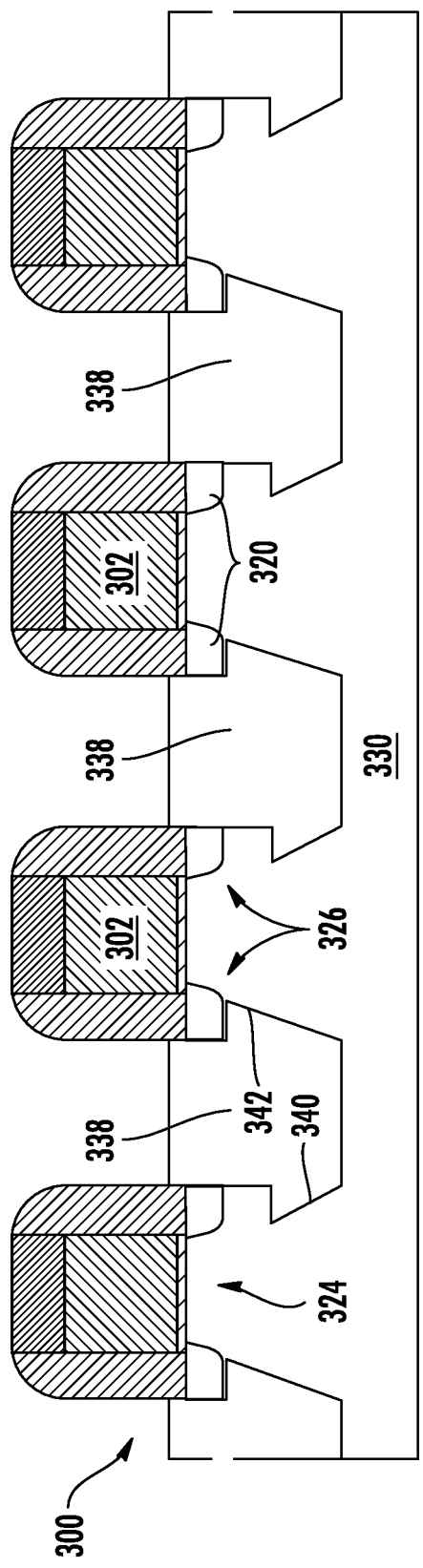
FIG. 3G depicts a side cross-sectional view of another embodiment in which an asymmetric cavity sidewall structure is formed.

FIG. 3G depicts another embodiment in which an asymmetric cavity sidewall structure is formed on different sides of a transistor channel 324. In this embodiment the embedded region 338 has a first cavity sidewall 340 that is shorter than the second cavity sidewall 342. The resulting structure of the embedded region 338 places material of the embedded region, which may be an embedded stressor, closer to the channel 324 on the side of the channel adjacent the second cavity sidewall 342. This structure may be useful in circumstances where asymmetric device properties are desired.

FIGS. 5*a* and 5*b* depict aspects of angled implantation to form the cavity structure of FIG. 3*g* according to further embodiments. In particular, substrate 300 depicted in FIG. 5*a* may be processed as depicted in FIGS. 3*a*, 3*b* to form the cavity structure with sidewalls 316. As illustrated in FIG. 5*a*, ions 502 are provided to left sidewalls 316L at at a third angle of incidence $\theta_3$, which may be the same as that of first angle of incidence $\theta_1$ depicted in FIG. 4*a*. Thereby, the altered regions 320*a* on the left sides of gates may be the same as those depicted in FIG. 4*a*. As illustrated in FIG. 5*b*, ions 504 are provided at a fourth angle of incidence $\theta_4$, which is steeper than the third angle of incidence $\theta_3$ such that the ions 504 form trajectories closer to normal. Thereby, the ions are less screened by gates 302 and intercept longer upper portions 316*f* of right cavity sidewalls 316R. Consequently, altered regions 320*c* are larger than altered regions 320*a*. As compared to lower portions 316*b*, this also creates a shorter lower portion of right cavity sidewalls 316R, which is unaltered. After subsequent anisotropic etching as generally described above with respect to FIGS. 3*d*, 3*e*, the resultant structure may be as shown in FIG. 3*g*.

In further embodiments, the implantation of ions 502 and 504 may be accomplished in a single exposure using, for example, a plasma based processing system in which ions are provided over an angular range that includes respective third and fourth angles of incidence $\theta_3$ and $\theta_4$. In these embodiments, the angular range of ions may be provided asymmetrically such that ions 502 are provided predominantly at the third angle of incidence $\theta_3$ on sidewalls 316L and ions 504 are provided predominantly at the fourth angle of incidence $\theta_4$ on sidewalls 316R.

Although the above embodiments generally depict processes and structures for formation of embedded stressor material within a semiconductor substrate, embodiments of the present disclosure include other structures in which shadowing of ions by surface relief features is used to selectively implant a portion of a cavity in a crystalline substrate. In some embodiments, material regrown within cavities may be recessed source/drain structures. In other embodiments, the surface relief features need not be transistor gate structures and the cavities to be implanted may be formed by any desired method. The selectively implanted portion may act as an etch stop for any system in which the implanted portions etches more slowly in a given etchant than the non-implanted portions. In this manner, a combination of parameters may be tuned to produce the exact shape of a cavity desired. Among others, the tunable parameters include ion species, ion incidence angle, ion energy, ion dose, h/W aspect ratio of the surface relief feature, and the type of cavity etch and cavity etch settings used to etch cavities after implantation. Among the latter settings are the duration, temperature and composition of a wet etch used to perform the cavity etch.

Figure 6:
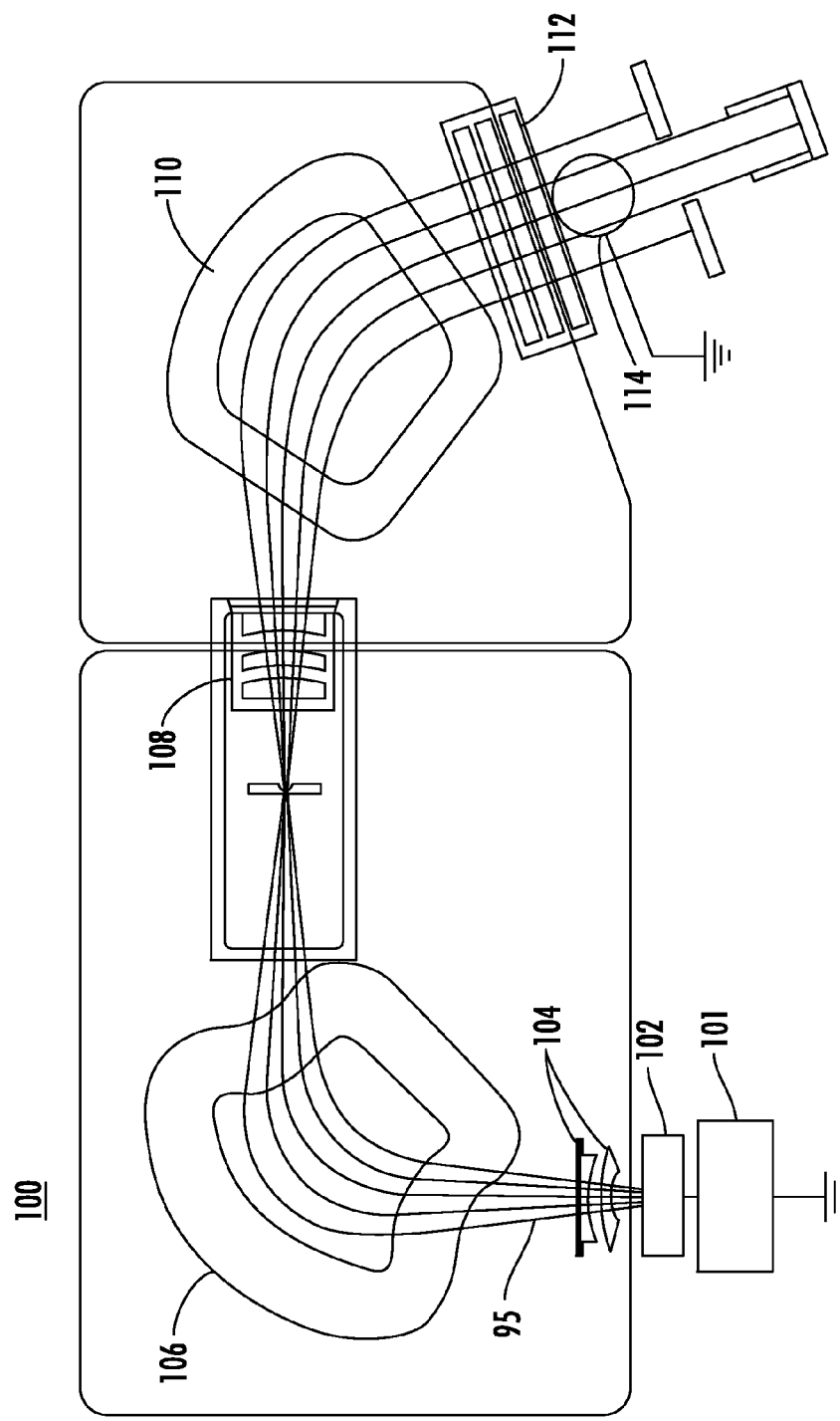
FIG. 6 depicts an embodiment of an ion implantation system.

FIG. 6 is a block diagram of an ion implanter that illustrates general features of ion implanters that may be used in embodiments of the present invention. System 100 includes an ion source chamber 102. A power supply 101 supplies the required energy to source 102 which is configured to generate ions of a particular species. The generated ions are extracted from the source through a series of electrodes 104 (extraction electrodes) and formed into a beam 95 which passes through a mass analyzer magnet 106. The mass analyzer is configured with a particular magnetic field such that only the ions with a desired mass-to-charge ratio are able to travel through the analyzer. Ions of the desired species pass through deceleration stage 108 to corrector magnet 110. Corrector magnet 110 is energized to deflect ion beamlets in accordance with the strength and direction of the applied magnetic field to provide a beam targeted toward a work piece or substrate positioned on support (e.g. platen) 114. In some cases, a second deceleration stage 112 may be disposed between corrector magnet 110 and support 114. The ions lose energy when they collide with electrons and nuclei in the substrate and come to rest at a desired depth within the substrate based on the acceleration energy.

In various embodiments of beamline ion implantation, the ions 95 may form a parallel beam at platen 114, and the platen may be rotated to provide a desired angle of incidence upon a substrate. For example, platen may be positioned in a first position to provide a first angle of incidence $\theta_1$ in a first exposure, and the platen may be rotated to second position to provide a second angle of incidence $\theta_2$ in a second exposure.

The present invention is not to be limited in scope by the specific embodiments described herein. Indeed, other various embodiments of and modifications to the present disclosure, in addition to those described herein, will be apparent to those of ordinary skill in the art from the foregoing description and accompanying drawings.

Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A method of modifying a shape of a cavity in a substrate, comprising:
   forming one or more cavities on a surface of the substrate between adjacent relief structures;
   directing ions toward the substrate at a non-normal angle of incidence, wherein the ions strike an upper portion of a cavity sidewall and are provided at an ion energy and ion dose that forms an altered portion of the substrate proximate the upper portion of the cavity sidewall, and wherein the ions do not strike a lower portion of the cavity sidewall;

etching the one or more cavities using a wet etch that etches unaltered substrate material faster than the altered portion of the substrate wherein the upper portion of the cavity sidewall etches more slowly than the lower portion of the cavity sidewall and wherein the wet etch etches substrate material along a first crystallographic plane faster than along a second crystallographic plane; and epitaxially growing an embedded region within the one or more cavities, wherein the embedded region comprises a keystone shape.

2. The method of claim 1, wherein the altered portion comprises one of: amorphized regions and regions implanted with boron at a concentration sufficient to reduce etch rate of the altered portion compared to the unaltered substrate material.

3. The method of claim 1, wherein the altered portion comprises extension regions of respective transistor gates.

4. The method of claim 1, wherein the embedded region comprises a stressor configured to induce a strain in at least a portion of the substrate proximate the stressor.

5. The method of claim 1, wherein the substrate comprises silicon and the embedded region comprises one or more of an SiGe alloy, Si:C, and Ge.

6. The method of claim 1, comprising etching the cavity in an etchant so as to etch portions of the substrate underneath the altered portions, wherein the cavity comprises an overhang structure.

7. The method of claim 1, wherein, before the directing the ions, each cavity comprises a first sidewall and a second sidewall opposite the first sidewall, the method further comprising:

directing first ions in a first exposure at a first angle of incidence such that the first ions strike the upper portion of the first sidewall; and directing second ions in a second exposure at a second angle of incidence such that the second ions strike the upper portion of the second sidewall.

8. The method of claim 7, comprising:

providing the first ions and second ions at respective trajectories that form a mirror image with respect to a substrate normal; and providing the first ions and second ions at the same ion energy and ion dose in the first exposure and second exposures.

9. A method of forming an embedded semiconductor stressor structure in a CMOS device, comprising:

providing, on portions of a first surface of a substrate of the CMOS device, a plurality of transistor gates defined by a gate spacing and a gate height;

etching the first surface of the substrate at regions between the plurality of transistor gates to define one or more cavities in the substrate, each cavity having a first and a second sidewall;

directing first ions in a first exposure at the first surface over a first angle of incidence, wherein the plurality of transistor gates shadow the first ions such that the first ions strike an upper portion of the first sidewall and do not strike a lower portion of the first sidewall;

directing second ions in a second exposure at the first surface over a second angle, wherein the plurality of transistor gates shadow the second ions such that the second ions strike an upper portion of the second sidewall and do not strike a lower portion of the second sidewall, wherein the first and second exposures create first and second amorphized regions of the substrate proximate the respective upper portions of the first and second sidewall and wherein the second angle is different from the first angle; and etching the one or more cavities using an etchant that etches substrate material proximate the respective lower portions of the first and second sidewalls faster than the substrate material proximate the respective upper portions of the first and second sidewalls, wherein an asymmetrical cavity structure is formed after the etching the one or more cavities.

10. The method of claim 9, wherein portions of the substrate outside of the cavity comprise a first semiconductor material, the method further comprising growing a second semiconductor material different from the first semiconductor material within the one or more cavities.

11. The method of claim 9, wherein the first and second amorphized regions comprise extension regions of adjacent transistor gates of the CMOS device.

12. The method of claim 11, wherein after the etching the one or more cavities, each of the extension regions overhangs a cavity of the one or more cavities.

* * * * *